US 6,642,863 B1

(12) United States Patent
Venkitachalam et al.

(10) Patent No.: US 6,642,863 B1
(45) Date of Patent: Nov. 4, 2003

(54) SAMPLE RATE CONVERTERS USING VIRTUAL SAMPLE RATES AND ANALOG TO DIGITAL AND DIGITAL TO ANALOG CONVERTERS USING THE SAME

(75) Inventors: Anand Venkitachalam, Pune (IN); Dylan Alexander Hester, Austin, TX (US); Brian Frank Bounds, Austin, TX (US); Rajendra Datar, Pune (IN); Krishnan Subramoniam, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/094,978

(22) Filed: Mar. 11, 2002

(51) Int. Cl.[7] .............................................. H03M 7/00

(52) U.S. Cl. .................................................... 341/61

(58) Field of Search .......................................... 341/61

(56) References Cited

U.S. PATENT DOCUMENTS

| 5,712,635 A | * | 1/1998 | Wilson et al. ............... 341/144 |
| 5,907,295 A | * | 5/1999 | Lin ............................. 341/61 |
| 5,963,160 A | * | 10/1999 | Wilson et al. ............... 341/143 |
| 6,362,755 B1 | * | 3/2002 | Tinker ......................... 341/61 |

* cited by examiner

Primary Examiner—Howard L. Williams
(74) Attorney, Agent, or Firm—James J. Murphy, Esq.; Winstead Sechrest & Minick (57) ABSTRACT

A method of performing sample rate conversion in a data converter operating from an oversampling clock corresponding to a native sample rate and a native oversampling factor. A virtual sample rate and a virtual oversampling factor are selected proportional to the native sample rate and the native oversampling factor. A data stream having a data sample rate is sampled by the virtual oversampling factor. The data stream is also resampled with a resampling ratio approximating a ratio of the data sample rate to the virtual sample rate.

20 Claims, 5 Drawing Sheets

SAMPLE RATE CONVERTERS USING VIRTUAL SAMPLE RATES AND ANALOG TO DIGITAL AND DIGITAL TO ANALOG CONVERTERS USING THE SAME

CROSS-REFERENCE TO RELATED APPLICATION

The following co-assigned application contains related information and is hereby incorporated by reference: Ser. No. 09/944,736, entitled "ANALOG TO DIGITAL CONVERTERS WITH INTEGRAL SAMPLE RATE CONVERSION AND SYSTEMS AND METHODS USING THE SAME", by inventors Anand Venkitachalam, et al., filed Aug. 31, 2001; and
Ser. No. 09/944,738, entitled "VARIABLE DUTY CYCLE RESAMPLING CIRCUITS AND METHODS AND SAMPLE RATE CONVERTERS USING THE SAME", by inventors Anand Venkitachalam, et al., filed Aug. 31, 2001; and
Ser. No. 10/090,331, entitled "SAMPLE RATE CONVERTERS WITH MINIMAL CONVERSION ERROR AND ANALOG TO DIGITAL AND DIGITAL TO ANALOG CONVERTERS USING THE SAME", by inventors Anand Venkitachalam, Rajendra Datar and Krishnan Subramoniam, filed Mar. 4, 2002.

FIELD OF INVENTION

The present invention relates in general to mixed analog and digital signal processing and in particular, to sample rate converters using virtual sample rates and analog to digital and digital to analog converters using the same.

BACKGROUND OF INVENTION

In many applications, converting data from its native analog form into the digital domain for processing, storage and transmission provides the best overall system performance. One well known example is audio processing where analog audio is digitized through analog to digital (A/D) conversion and then processed, for example filtered or compressed, and then stored on a digital storage medium such as a compact disk (CD) or digital video disk (DVD). On playback, the digital data is decompressed, as required, reconverted to analog through digital to analog (D/A) conversion, and finally presented to the end user as audible tones.

Another example is digital telephony, where speech is digitally encoded at the transmitting end, carried in digital form across a digital medium such as a network, and then reconstructed at the receiving end.

According to the Nyquist Theorem, so long as the analog waveform is sampled during A/D conversion at a sampling frequency at least twice as high as the highest frequency component, that waveform can be successively reconstructed during subsequent D/A conversion. In actual practice, oversampling A/D and D/A converters are typically used because of their relative ease in implementation. For example, in an 8x oversampling converter operating on data with a base sampling rate of 44.1 kHz, the data are sampled at a rate of 352.8 kHz. At the higher sampling rate, operations such as anti-aliasing filtering are easier since a substantial amount of the noise power is translated to frequency bands well above the band of the signal of interest.

Sample rate conversion is an additional problem which must be addressed when processing digitized analog data. Specifically, there are a number of different standard audio sampling rates, such as 48 kHz, 44.1 kHz, 22.05 kHz, 16 kHz and 8 kHz. Therefore, in order to properly interface systems operating on audio data at different ones of these rates, sample rate conversion must be performed. There are several existing sample rate conversion techniques, including decimation for lowering the sampling rate and interpolation for increasing the sampling rate. Notwithstanding, these techniques are still subject to some significant disadvantages including the need for substantial silicon area for fabricating the requisite interpolation/decimation filters, as well as limitations on the ability to convert to fractional sampling rates.

SUMMARY OF THE INVENTION

The principles of the present invention are embodied in sample rate conversion circuits and methods. According to one such method, sample rate conversion is performed in a data converter operating from an oversampling. clock corresponding to a native sample rate and a native oversampling factor. A virtual sample rate and a virtual oversampling factor are selected to be proportional to the native sample rate and the native oversampling factor. A data stream having a data sample rate is sampled by the virtual oversampling factor. The data stream is also resampled with a resampling ratio approximating a ratio of the data sample rate to the virtual sample rate.

Circuits and methods embodying the inventive principles allow data streams of different sample.rates to be processed in systems clocked at clock frequencies which do not necessarily match one or more of these sample rates. For example, methods are disclosed for processing standard sample rate audio data in an audio codec operating from an oversampling clock which is a sub-multiple of the standard Universal Serial. Bus clock. This oversampling clock when used to oversample at a standard oversampling ratio results in some instances in a native sample rate is less than the sample rate of the audio data being converted. The present methods and circuits address the problem of this mismatch.

BRIEF DESCRIPTION OF DRAWINGS

For a more complete understanding of the present invention, and the advantages thereof, reference is now-made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1A:
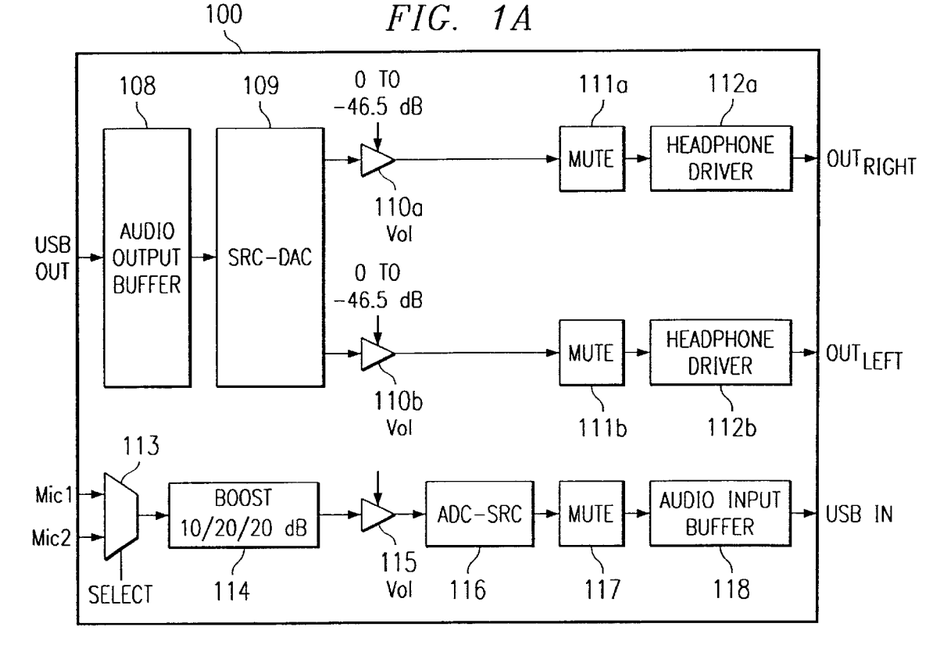
FIGS. 1A and 1B are respectively, functional block diagrams of an exemplary USB codec suitable for describing the present inventive concepts and an exemplary system demonstrating the use of such USB codec.

FIG. 1A is a high level functional block diagram of a Universal Serial Bus (USB) Audio Codec 100 suitable for practicing the present inventive concepts. Codec 100 generally includes an output path for converting digital audio data received from an external USB through port USB_Out into analog for driving a headset or set of external speakers. An input path converts analog data from a microphone or similar input device into digital form for transmission onto the external USB bus via the port USB_In.

Figure 1B:
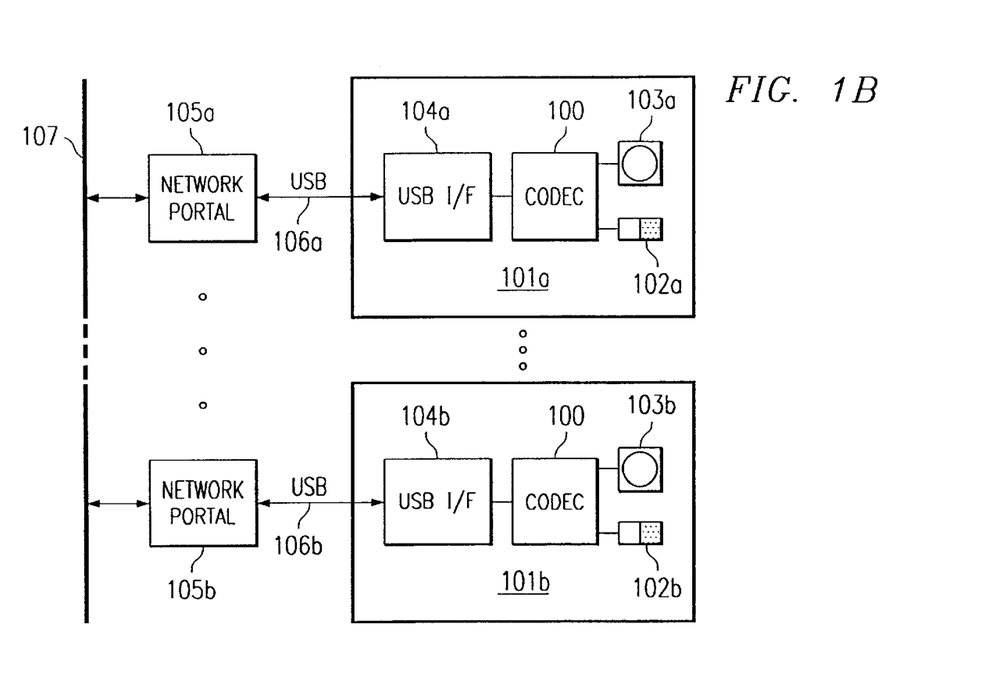

One possible application of Codec 100 is in two-way IP (Internet Protocol) telephony via a USB, as illustrated in FIG. 1B. In this example, Codec 100 is used in telecommunications terminals 101a,b each including a conventional audio microphone 102 and one or more speakers 103 such as those found in a typical speakerphone. A standard USB interface 104 supports a connection to a network portal 105 through USB 106. Network portal 105 may be, for example, a personal computer or other network appliance providing the interface with network 107. Network 107 is preferably a global network such as the Internet or the World Wide Web, but could also be a more localized public or private network such a WAN (wide area network) or LAN (local area network).

Returning to FIG. 1A, digital data received from the USB is buffered in audio output buffer 108 before conversion to analog by two-channel integrated SRC-DAC 109, which will be discussed in further detail below. In the preferred embodiment, Codec 100 operates in the master mode and therefore requests (pulls) data from the USB for input to audio output buffer 108.

The data output from the USB can be either mono or stereo. To support left and right stereo data, Codec 100 includes left and right output channels through integrated SRC-DAC 109. The following analog portion of each channel includes analog volume controls 110a,b and mute circuits 111a,b. On-chip headphone drivers 112a,b drive an external headphone or speakers, such as those found on a conventional speakerphone.

The analog path to the USB input includes, in the illustrated embodiment, an input multiplexer 113 for selecting between a pair of microphones (Mic1 and Mic2) similar to those shown in FIG. 1B or other analog audio input devices. The input analog signal is then boosted in block 114 by 10, 20 or 30 db before being passed through analog volume controls 115. The analog data are then converted to digital form by integrated ADC-SRC circuitry 116, also discussed further below. The digital data are then passed through digital mute controls 117 before transmission onto the USB through audio input buffer 118.

As previously indicated, in order to have an interface device, such as Codec 100, which is suitable for a range of applications, sample rate conversion is a necessary feature. For discussion purposes, first consider a conventional Delta-Sigma modulator-based A/D converter with sample rate conversion as shown in block 200 in FIG. 2A. In this case, the analog waveform is passed through an oversampling Delta-Sigma modulator 201 and converted to a 1-bit stream at the oversampling rate. The modulator also shapes the resulting quantization noise and generally translates that noise to a frequency band well above that of the signal interest. The modulator output is then passed through digital filters 202 and 203 which filter the 1-bit data to perform wideband anti-aliasing and decimate and convert the data to produce a stream of multiple-bit samples at a lower sampling rate.

Figure 2A:
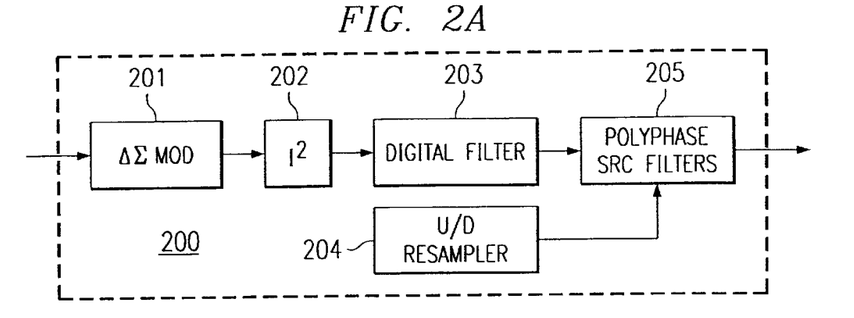
FIG. 2A is a functional block diagram of a conventional analog to digital converter-sample rate converter (ADC-SRC) subsystem.

Continuing with the conventional scheme, the multiple bit digital data then pass through polyphase SRC filters 205 under the control of up-conversion/down-conversion circuitry 204 to achieve the desired final sampling rate. Typically, during sample rate conversion these data are first upconverted, then filtered and then finally down converted such that the final sampling rate is:

$$f_{out} = U/D \cdot f_{in}$$

where U is the up-sampling factor and D is the down-sampling factor.

As should be apparent from this brief description, the traditional A/D-sample rate conversion scheme is not optimized to reduce silicon area use. This is particularly true with respects to the multiple filter stages that are required to implement the various conversion processes. Hence, one of the purposes of the present concepts to combine filtering functions to minimize the required hardware, while at the same time still allow for fractional sample rate conversion.

Figure 2B:
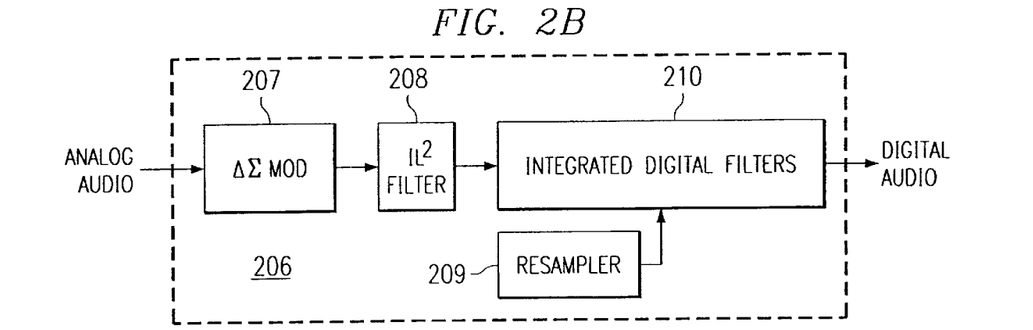
FIG. 2B is a functional block diagram of a preferred integrated analog to digital converter-sample rate converter (ADC-SRC) embodying the inventive concepts.

FIG. 2B is a functional block diagram of a preferred integrated analog to digital converter-sample rate converter (ADC-SRC) 206 embodying the inventive concepts and suitable for use in ADC_SRC block 116 of Codec 100. The analog input waveform is sampled and converted into a 1-bit data stream at the selected oversampling rate by delta-sigma modulator 207. Delta-sigma modulator 207 also shapes the quantization noise as a function of the selected modulator order such that the majority of that noise is shifted to frequencies above the base-band of interest (in this case the audio band).

If the output from delta-sigma modulator 207 were to be directly resampled for sample rate conversion, high frequency noise will alias (fold-back) into the audio-band. Specifically, the signal output from the modulator, including the data and the quantization noise, will be generally a repeating spectrum of relatively broad band. Therefore, in order to avoid aliasing back into the base-band after sampling, filter 208 should be a low pass filter with a narrow or very narrow pass-band. Moreover, the stop band attenuation must be substantial, for example, −80 db or more. As discussed in detail below, filter 208 is preferably a two stage Leaky Integrator (IL$^2$) filter which filters out the high frequency noise while still remaining stable around the DC point.

The output from IL$^2$ filter 208 is then passed through an integrated digital filter (IDF) 210 which outputs multi-bit digital data at the desired new base-band rate through decimation. The decimation is controlled by resampling circuitry 209 which is described in detail below. By careful selection of IL$^2$ filter 208, the complexity and silicon area consumed by IDF 210 can be advantageously reduced. For example, for a typical audio application, the required area can be approximately halved.

The resampled data are selectively down-sampled by a virtual oversampling factor $N_{Virtual}$. As described further below, $N_{Virtual}$ in part allows the native oversampling rate and native sample rate of the data output from the delta-sigma modulator to be matched with the desired output sample rate.

An $IL^2$ filter 208 is the preferred choice at the modulator output because it is the most. practical design which minimizes the silicon area required. For example, finite impulse response (FIR) or infinite impulse response (IIR) filters with narrow pass-bands and high stop band-attenuation could be used; however, such filters would have to be of a very large order thereby requiring a large number of stages and consequently significantly more silicon area. Integrator stages of cascaded integrator comb (CIC) filters are another possibility; however, if a CIC is used in combination with a resampler, instabilities can occur, especially at DC since an ideal integrator has a pole at DC.

The preferred transfer function for a two-stage cascaded leaky integrator embodiment of $IL^2$ filter 208 is:

$$H(z)=\{z^{-1}/[1-(1-\delta)z^{-1}]\}^2$$

where δ is the leaky factor which is preferably a very small value, for example, $2^{-6}$ The maximum gain occurs at DC and is approximately 1/δ. The choice of δ is a tradeoff between hardware and filter performance; as δ increases the stop band attenuation increases but the DC gain also increases forcing a wider data path width. Advantageously, since the poles of the leaky integrator are within the unit circle, it is unconditionally stable.

Since $IL^2$ filter 208 filters out most of the high frequency components, the constraints on IDF 210 are consequently relaxed. Preferably, IDF 210 includes a decimation stage which can be implemented, for example, with a CIC filter followed by a FIR or an IIR filter of much lower order. Additionally, IDF 210 also includes magnitude and/or phase compensation filters operating at the output sample rate. These compensation filters are used to compensate for any pass-band droop and/or non-linear phase shifting introduced by the leaky integrator and decimation filters.

Resampling circuitry 209 preferably implements the decimation operation by generating an enable signal controlling the clocking of data through IDF 210. Specifically, resampler 209 generates a control signal Sample_Valid with a duty cycle approximating the ratio of the output sampling rate to the input sampling rate. In other words, IDF 210 only processes samples when Sample_Valid is active and is idled when Sample_Valid is inactive. By periodically varying the duty cycle of Sample_Valid, accumulated error due to the fact that the ratio of the output sampling rate to the input sampling rate is only approximated by Sample_Valid is minimized. For example, Sample_Valid is used to drop oversampling clocks controlling one or more of the filter stages of IDF 210 to effectuate a decimation.

Figure 2C:
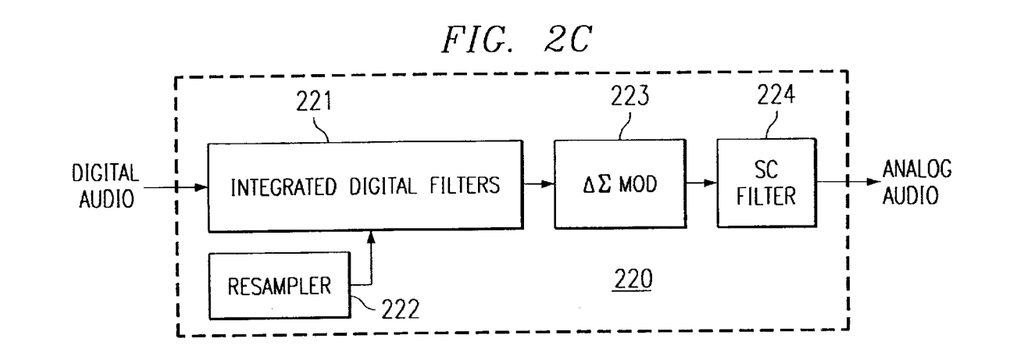
FIG. 2C is a functional block diagram of a preferred integrated sample rate converter-digital to analog (SRC-DAC) embodying the inventive concepts.

Sample_Valid can also be used to time a zero-order hold or similar function such that an interpolation can be implemented. This is illustrated in FIG. 2C, which is a block diagram of a preferred architecture for integral SRC-DAC 220, one particular use of which is in SRC-DAC block 109 of Codec 100 shown in FIG. 1A. In this case, the digital input data is upsampled by IDF 221 and resampler 222. When SRC-DAC 109 is performing the inverse process to the ADC-SRC operation, the same ratio for Sample_Valid is used, only in this case samples are added (e.g. by a zero-order hold) during the inactive cycles of Sample_Valid. A delta-sigma modulator 223 and switched capacitor filter 224 generate the final analog output.

IDF 221 also includes oversampling circuitry which selectively oversamples (up-samples) the incoming digital data samples by a virtual oversampling factor $N_{Virtual}$, which will be discussed further below.

Generally, an approximate (rounded) conversion factor is calculated from the ratio of the rate of the input signal to the rate of the desired output signal in a first embodiment. Depending on the value of this ratio being closer to unity or otherwise, the objective is to calculate active and inactive clock cycles that approximate this ratio. Although this embodiment may be subject to conversion error due to the approximation, this error could still be within specifications. The approximation however helps in achieving a very efficient hardware implementation.

A nominal duty cycle for Sample_Valid in terms of active clock cycles versus total clock cycles over a given period, with 1 inactive cycle per such period assumed, is then calculated which approximates the desired conversion factor. Since this nominal duty cycle is only approximate, if Sample_Valid is used uncorrected as the clock enable signal, an error will accumulate in the sample rate conversion process. Therefore, periodically the duty cycle of Sample_Valid is changed from the nominal to compensate for the accumulated error. Specifically, the duty cycle is stepped as required to introduce a canceling error equal in magnitude but opposite in sign to the accumulated error.

Figure 3A:
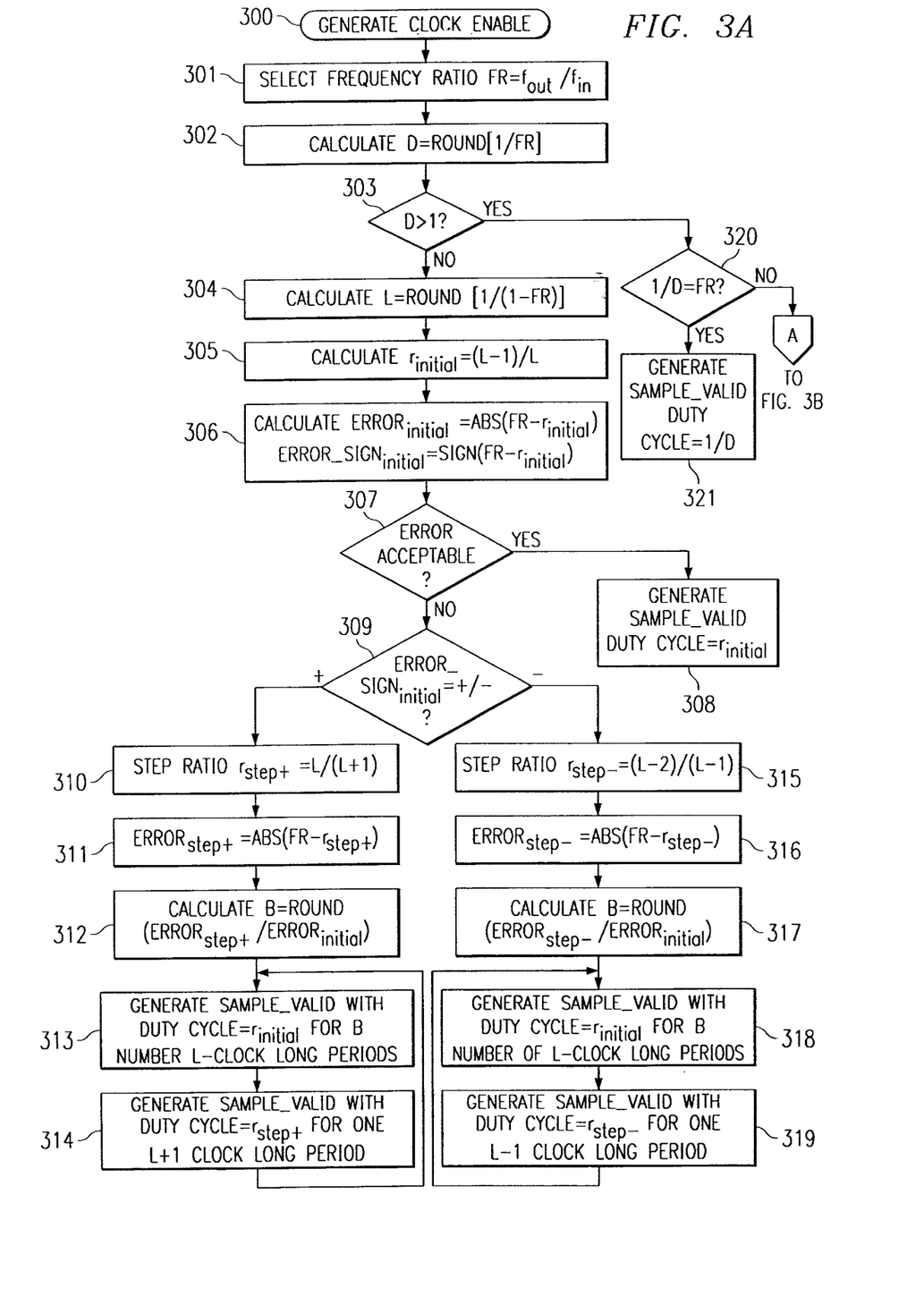
FIG. 3 is a flow chart illustrating a preferred procedure for performing synchronous re-sampling with accumulated error compensation.
Figure 3B:
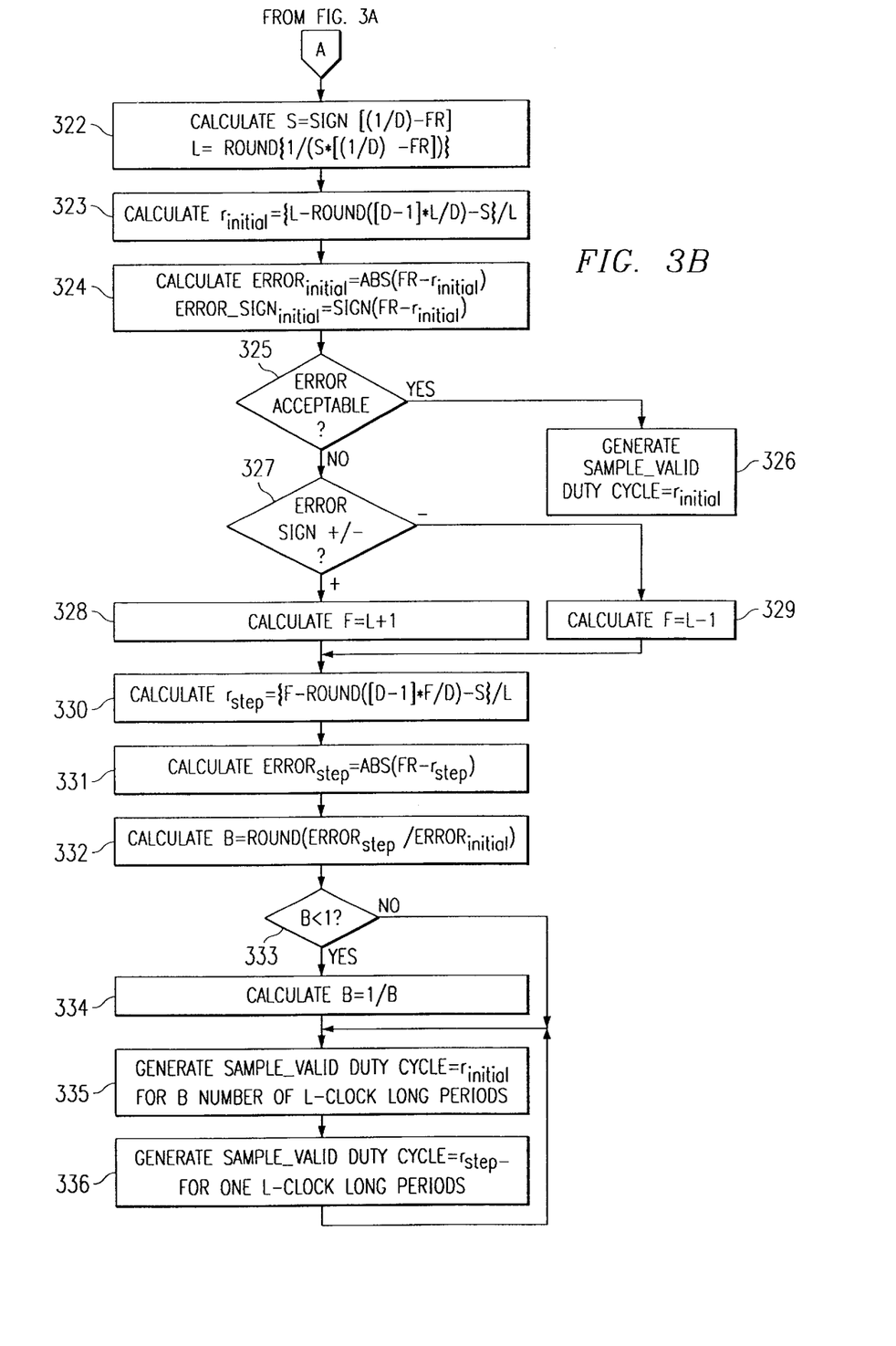

FIG. 3 is a flow chart illustrating a preferred general procedure 300 for performing synchronous re-sampling, by generating Sample-Valid described above. Procedure 300 can be used either for interpolation or decimation; a basic decimation example is given below to demonstrate its application.

At Step 301, the frequency ratio (FR) of the desired output rate (frequency) to the desired input rate (frequency) is first determined. Specifically:

$$FR=f_{OUT}/f_{IN}$$

where $f_{out}$ is the frequency of the output stream and fin is the frequency of the input stream.

From the frequency ratio, a factor D is calculated at Step 302.

$$D=\text{round}[1/FR]$$

At step 303, a determination is made as to whether D is greater than to one. Consider first the case where D is not greater than one. In this case, the factor L is calculated at Step 304 where:

$$L=\text{round}[1/(1-FR)]$$

L helps minimize the distortion caused by the decimation process. L represents, in number of clock cycles, one period, including active and inactive cycles, over which the duty cycles is to be selected.

For each period L, one clock cycle of Sample_Valid will be inactive and the remaining clock cycles will be active. Taking into account this assumption, the initial ratio of active cycles to total clock cycles over the period L (i.e. the duty cycle) is calculated at Step 305:

$$r_{INITIAL}=(L-1)/L$$

As previously indicated, $r_{INITIAL}$ introduces a quantum of error with each period L with respects to the actual desired frequency ratio FR. This error and its sign are determined at Step 306 where:

$$\text{Error}_{INITIAL}=\text{abs}(FR-r_{INITIAL}); \text{ and}$$

$$\text{Error\_Sign}_{INITIAL}=\text{sign}(FR-r_{INITIAL}).$$

Over the course of B number of periods L, the accumulated error becomes:

$$\text{Error}_{ACCUMULATED}=B\cdot\text{Error}_{INITIAL}$$

If at Step 307, the error calculated at Step 306 is acceptable, then at Step 308 Sample_Valid is generated using $r_{INITIAL}$ as the duty cycle. Otherwise, the problem becomes one of selecting a value for B and a new duty cycle which can be inserted for one period after B number of L clock wide periods to introduce an error of opposite sign and magnitude to $Error_{ACCUMULATED}$.

At Step 309, the sign of initial error ($Error\_Sign_{INITIAL}$), is observed. The case where $Error\_Sign_{INITIAL}$ is positive will be considered first. Here, the ratio in number of active clock periods to total clock periods of Sample_Valid is stepped at Step 310;

$$r_{STEP+} = L/(L+1)$$

In the preferred embodiment, for the compensation period the number of inactive clock cycles remains fixed at one; therefore, in this case the number of active cycles is increased by 1 to L and the total number of clock in the period increased from L to L+1.

The corresponding error introduced by $r_{STEP+}$ is (Step 311):

$$Error_{STEP+} = abs(FR - r_{STEP+})$$

Consequently, a value for B is calculated at Step 312 preferably as:

$$B = round(Error_{STEP+}/Error_{INITIAL})$$

At Steps 313 and 314, Sample_Valid is generated for a positive initial error. Specifically, Sample_Valid is generated with B number of L-clock long periods at the initial ratio (duty cycle) $r_{INITIAL}$ and the corresponding error is accumulated (Step 313). The next period is L+1 total clock periods long, with L-number of active periods and 1 inactive period, in accordance with the stepped ratio (duty cycle) $r_{STEP+}$ is (Step 314). This process is repeated to generate Sample_Valid as needed for up-converting or down-converting. A small residual error remains which is approximately:

$$Error_{RESIDUAL} = FR - [B \cdot (L-1) + L/(B \cdot L) + L + 1]$$

This error will typically be small enough to be within the given specification. Similar steps are performed when $Error\_sign_{INITIAL}$ is negative at Step 309. In this case, the new inactive to active ratio is calculated at Step 315 to be:

$$r_{STEP-} = (L-2)/(L-1)$$

Here, the total number of clock cycles in the period is decreased by one to L−1 and the total number of active cycles is reduced from the initial value of L−1 to L−2. The number of inactive clock cycles per total clock cycles per period in the preferred embodiment remains at 1.

The compensating error then becomes at Step 316:

$$Error_{STEP-} = abs(FR - r_{STEP-})$$

The period number B is calculated at Step 317 as:

$$B = round(Error_{STEP-}/Error_{INITIAL})$$

The signal Sample_Valid is generated at Steps 318 and 319. Again, B number of periods L are made at the ratio $r_{INITIAL}$ for every L−1 clock long period at the ratio $r_{STEP-}$. In this case the residual error is:

$$Error_{RESIDUAL} FR - [B \cdot (L-1) + (L-2)/(B \cdot L) + L - 1]$$

Returning to Step 303, now consider the case where 1/D=FR at subsequent Step 320. Here the estimated duty cycle D is close to the inverse of the desired frequency ration FR; therefore, at Step 321 Sample_Valid is generated with a duty cycle 1/D.

If D is greater than one, but not equal to 1/FR, at Steps 303 and. 320, then the factor L and a sign value S are calculated at Step 322:

$$S = sign((1/D) - FR)$$

$$L = round(1/(S*[(1/D) - FR]))$$

The initial ratio of active clock cycles to total clock cycles $r_{INITIAL}$, is calculated at Step 323 as:

$$r_{INITIAL} = \{L - round([D-1]*L/D) - S\}/L$$

The error and error sign are calculated at Step 324 as:

$$Error_{INITIAL} = abs(FR - r_{INITIAL}); \text{ and}$$

$$Error\_Sign_{INITIAL} = sign(FR - R_{INITIAL}).$$

If at Step 325, the error is found to be acceptable, then Sample_Valid is generated at Step 326 with a duty cycle of $r_{INITIAL}$. Otherwise, the error sign is evaluated at Step 327.

Consider the case where the error sign is positive at Step 327. In this case, a factor F is calculated at Step 328 as:

$$F = L + 1$$

On the other hand, if the error sign is negative at Step 327, then factor F is calculated at Step 329 as:

Once F is calculated, the ratio is stepped at Step 330, where:

$$r_{STEP} = \{F - round([D-1]*F/D) - S\}/L$$

The error is then calculated (Step 331):

$$Error_{STEP} = abs(FR - r_{STEP}).$$

The factor B is calculated in this case at Step 332 as:

$$B = round(Error_{STEP}/Errror_{initial})$$

A test is performed at Step 333 to determine whether B is less than 1. If it is, then B becomes 1/B at Step 334 and the process continues to Steps 335 and 336 for the generation of Sample_Valid. Otherwise, the process proceeds directly to Steps 335 and 336, where Sample_Valid is generated with a duty cycle of $r_{INITIAL}$ for B number of L-clock cycle long periods and with a duty cycle of $r_{STEP}$ for one L-clock cycle long period.

The application of procedure 300 can be demonstrated with respects to the down conversion of audio data recorded at a sampling frequency 48 kHz and a sampling frequency of 44.1 kHz for pre-playback processing. A maximum error of ±1000 ppm in the 44.1 kHz data stream is the exemplary specification value. In this case:

| | | |
|---|---|---|
| FR = | 44100/48000 | = 0.91875 |
| L = | round[1/(1 − 0.91875)] | = 12 |
| $r_{INITIAL}$ = | (12 − 1)/12 | = 0.9166 |
| $Error_{INITIAL}$ = | 0.91875 − 0.9166 | = 0.00215 |
| $Error\_Sign_{INITIAL}$ | | = positive |
| Frequency Error = | 44100 − (0.9166 · 48000) | = 100 Hz or 2267 ppm. |

Since the error in the output frequency of 2267 ppm well exceeds the specified ±1000 ppm, and the initial error sign Error_Sign$_{INITIAL}$ is positive, a period L with a compensation duty cycle r$_{STEP+}$ must be inserted after every B number of periods L at the ratio r$_{INITIAL}$. The exemplary calculations are as follows:

| | | |
|---|---|---|
| r$_{STEP+}$ = | 12/(12 + 1) | = 0.9230 |
| Error$_{STEP}$ = | 0.91875 − 0.9230 | = 0.00425 |
| B = | round(0.00425/0.00215) | = 2 |

Figure 4:
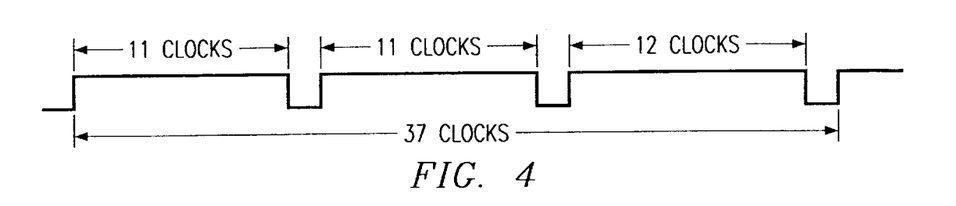
FIG. 4 is a diagram of an exemplary waveform of a control signal used to time the synchronous re-sampling operations described in FIG. 3.
Figure 5:
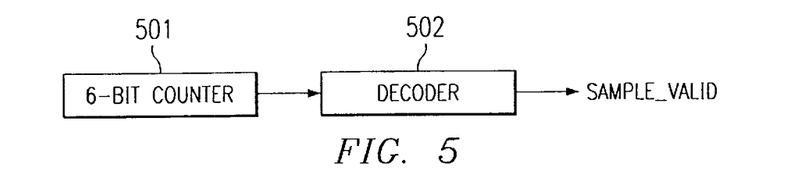
FIG. 5 is a high level functional block diagram demonstrating the generation of the waveform of FIG. 4 in hardware or software with a counter and a decoder.

The resulting waveform is then a periodic function as illustrated in FIG. 4. FIG. 5 is a high-level functional block diagram demonstrating how this waveform can be generated in hardware or software with a counter 501 and a decoder 502. For this example, counter 501 counts from 0 to 36 and then wraps back to 0. Decoder 502 decodes the count to switch Sample_Valid low (inactive) for 1 clock cycle at count values of 11, 23 and 36. The error in the final frequency is well below the specified ±1000 ppm maximum:

| | | |
|---|---|---|
| Ratio = | (2 · 11 + 12)/(2 · 12 + 13) | = 0.918989 |
| Frequency Error = | 44100 − (0.918989 · 48000) | = 8.1 Hz or 183 ppm |

Now consider a particular embodiment of Codec 100, which not only interfaces with a Universal Serial Bus (USB) as described above, but also supports a set of standard audio sample rates. Again, one of the primary goals is to maximize silicon—efficiency by minimizing the size and complexity of the required circuitry. At the same time, an error rate of 1000 ppm or less during sample rate conversion is the preferred target.

The USB protocol is based on a 48 MHz clock; therefore, to avoid the need to include a phase-locked loop or similar relatively complex clock synthesis circuitry, multiples or sub-multiples of this clock are preferably used to drive the various circuit blocks of Codec 100. In the preferred embodiment, the system clock frequency is chosen to be 24 MHz and the clock frequency for the 1-bit delta-sigma modulators 207, 223 and associated switched capacitor filters 224 to be 6 MHz. These frequencies can be generated from the output of a 12 MHz crystal oscillator and simple division or multiplication. Other frequency sets can be used in alternate embodiments.

For discussion purposes, assume that the native oversampling factor for the date converters of SRC-DAC block 109 and ADC-SRC block 116 is 128. A 128 times oversampling factor in a delta-sigma modulator running at 6 MHz corresponds to a native USB sampling rate of 6 MHz/128 or 46.875 kHz. This frequency however is not directly related to the standard audio sample rates (e.g. 48, 44.1, 22.05, 16 and 8 kHz). This fact must be addressed during conversion for properly processing standard audio data in a system designed to run off multiples and sub-multiples of the USB clock.

The sample rate conversion procedure discussed above is generally applicable for standard audio sample rates below 48 kHz when delta-sigma modulators and switched-capacitor filters, running from 6 MHz oversampling clock, are used. However, the 48 kHz audio oversampling rate exceeds the 46.875 kHz the native USB oversampling rate; and therefore, since the duty cycle of the resampler circuitry cannot exceed 100%, some modification of the circuits and procedures discussed above must be made to accommodate the 48 kHz and similar cases.

Considering first the case of integrated SRC-DAC 109. In the preferred embodiment, a virtual sample rate F$_{virtual}$, is selected which is greater than or equal to the maximum incoming data sample rate F$_{srate\_in\_max}$. In other words:

$$F_{virtual} >= F_{srate\_in\_max}$$

where F$_{srate\_in\_max}$ is 48 kHz in the present example.

The virtual oversampling factor N$_{virtual}$ is then chosen to match this virtual clock frequency to the native USB clock:

$$N_{virtual} * F_{virtual} = 128 * F_{srate\_mod}$$

Two preferred criteria for selecting F$_{virtual}$ and N$_{virtual}$ are: (1) F$_{Virtual}$ should be close to the native data sample rate, in this case 46.875 kHz, to maximize the number of clock cycles available for filtering; and (2) since N$_{virtual}$ effectively sets a rate of interpolation, it is preferably an integer to reduce the complexity of the design. In the present USB example, values of N$_{Virtual}$ and F$_{Virtual}$ meeting these criteria are respectively 120 and 50 kHz, although other choices are also possible.

In the case of DAC 109, the incoming data stream at the input sample rate is oversampled by N$_{vitual}$ in IDF block 221. The oversampled data stream is then resampled (interpolated) by resampler 222 to convert the data stream to a base rate of virtual sample rate oversampled by the virtual oversampling factor. Specifically, Sample_Valid is generated having a duty cycle which approximates the ratio of F$_{srate\_in}$ to F$_{Virtual}$:

$$Duty\_cycle = F_{srate\_in} / F_{Virtual}$$

The outlined procedure of FIG. 3, for an input sample rate of 48 kHz and a virtual sample rate of 50 kHz, yields a ratio with 0 ppm when:

$$Duty\_Cycle = 48000/50000 \text{ Hz or } 24/25.$$

For integrated SRC-DACs 109, an interpolation is performed by a zero-order hold every 24$^{th}$ out of 25 samples. The interpolated data now at the virtual sample rate are then converted in delta-sigma modulator 223 and the switched capacitor filter 224 running at the 6 MHz oversampling rate using the virtual oversampling factor N$_{Virtual}$. Conversion of the resampled data at 50 kHz base sample rate data and an oversampling factor of 120 with a 6 MHz oversampling clock (50 kHz=6 MHz/120) is equivalent to conversion of 46.875 kHz data with an oversampling factor of 128 and a 6 MHz clock (46.875 kHz=6 MHz/128).

It should be recognized that these principles could also be applied for performing sample rate conversion for standard sample rates, which are less than the native oversampling frequency, as well as for different allowable errors. For example, for a conversion from a sample rate of 44.1 kHz with a 400 ppm error and a native sample rate of 46.875 kHz:

$$Duty\_Cycle = 44100/50000 \text{ or } 15/17.$$

With respect to ADC_SRC 116 the principles discussed above also apply, although in this case decimation is performed during sample rate conversion. In this case, the analog input data are oversampled by the 128 native oversampling factor and the 6 MHz clock in delta-sigma modulator 207. Resampler 209 then resamples the filtered digital data stream. For the particular case of 48 kHz output data with 0-ppm error, the 24/25 resampling ratio is used to decimate 1 sample per 25 samples. The resampled data are then down-sampled by the virtual oversampling factor Nvirtual to arrive at the 48 kHz output sample rate.

Figure 6:
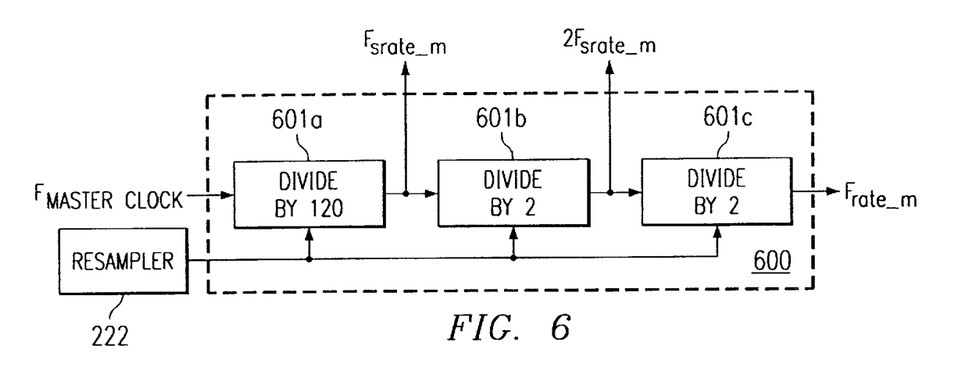
FIG. 6 is a functional block diagram of preferred clock generation circuitry according to the inventive principles.

In the preferred USB configuration, the Codec 100 operates in the master mode and therefore generates a clock, which is used to demand digital samples from the USB port at $F_{srate\_in}$. FIG. 6 is a functional block diagram of one resampler-clock divider circuit 600 suitable for performing this function, and includes resampler 222 which enables a chain of clock dividers 601$a,c$. The depicted circuit also generates the clocks 4 $F_{SRATE\_IN}$ and 2$F_{SRATE\_IN}$, which can be used in filtering operations. In other words:

$$F_{srate\_in} = (F_{MasterClock} * \text{SAMPLE\_VALID})/\text{DIVIDER\_VALUE}.$$

Divider_value is determined from the master clock frequency and the virtual clock frequency, where:

$$\text{DIVIDER\_VALUE} = F_{MasterClock}/F_{Virtual}.$$

For the 24 MHz master clock, $F_{Virtual}$ of 50 kHz and a SAMPLE_VALID of 24/25, therefore:

$$\text{DIVIDER\_VALUE} = 24 \text{ MHz}/50 \text{ KHz or } 480; \text{ and}$$

$$F_{srate\_in} = (24 \text{ MHz}*24/25)/480 \text{ or } 48 \text{ kHz}.$$

In sum, sample rate conversion circuits and methods embodying the inventive concepts advantageously allow for sample rate conversion in instances where the device master clock is not an integral multiple of the data sample rate. It should also be noted that in applying these concepts, aliasing and other artifacts in the ultimate audio output are no greater a problem than in conventional sample rate conversion processes. For example, for the case of a 6 MHz modulator clock, a 48 kHz audio sampling rate, and a resampling ratio of 24/25, the fundamental tone will be at 240 kHz. Assuming a 20 kHz audio baseband, the folding around this fundamental tone will extend from 240 to 260 kHz, well outside the audio baseband such that no aliasing will occur.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method of performing sample rate conversion in a data converter operating from an oversampling clock corresponding to a native sample rate and a native oversampling factor comprising the steps of:
   selecting a virtual sample rate and a virtual oversampling factor proportional to the native sample rate and the native oversampling factor of the data converter;
   sampling a data stream having data sample rate by the virtual oversampling factor; and
   resampling the data stream with a resampling ratio approximating a ratio of the data sample rate to the virtual sample rate.

2. The method of claim 1 wherein said step of resampling comprises the step of interpolating the data stream.

3. The method of claim 1 wherein said step of resampling comprises the step of decimating the data stream.

4. The method of claim 1 wherein the data sample rate is greater than the native sample rate.

5. The method of claim 1 wherein the data converter comprises a digital to analog converter and said step of sampling comprises the step of oversampling the data stream prior to said step of resampling.

6. The method of claim 1 wherein the data converter comprises an analog to digital converter and said step of sampling comprises the step of down-sampling the data stream after said step of resampling.

7. The method of claim 1 wherein:

$$F\text{Virtual}*N\text{Virtual} = F\text{Native}*N\text{Native}$$

where:
   FNative is the native sample rate;
   NNative is the native oversampling factor;
   FVirtual is the virtual sample rate; and
   NNative is the virtual oversampling factor.

8. An integrated sample rate and digital to analog converter operating at a selected oversampling rate corresponding to a native sample rate and a native oversampling factor comprising:
   oversampling circuitry for oversampling an input digital data stream of an input data sample rate by a virtual oversampling factor proportionate with the native oversampling factor;
   a resampler for resampling the oversampled data stream by a resampling ratio approximating a ratio of the input sample rate to a virtual sampling rate, the virtual sample rate proportionate with the native sample rate; and
   digital to analog conversion circuitry for converting the resampled data stream to analog at the oversampling rate.

9. The integrated sample rate and digital to analog converter of claim 8 wherein the virtual sample rate is greater than the native sample rate.

10. The integrated sample rate and digital to analog converter of claim 8 wherein the virtual sample rate is an integer sub-multiple of the oversampling rate.

11. The integrated sample rate and digital to analog converter of claim 10 wherein the input sample rate is a non-integer multiple of the native sample rate.

12. The integrated sample rate and digital to analog converter of claim 8 wherein the digital to analog conversion circuitry comprises a delta-sigma modulator and a switched-capacitor filter.

13. The integrated sample rate and digital to analog converter of claim 8 wherein the input stream comprises audio data at a standard audio sampling rate.

14. The integrated sample rate and digital to analog converter of claim 8 wherein the oversampling rate is a sub-multiple of a universal serial bus clock frequency.

15. The integrated sample rate and digital to analog converter of claim 8 wherein the oversampling rate is nominally 6 MHz, the native oversampling factor is nominally 128 and the input sample rate is nominally 48 kHz.

16. An integrated analog to digital and sample rate converter comprising:
   a delta-sigma modulator for converting analog data into a stream of digital data and operating at an oversampling rate corresponding to a native sample rate and native oversampling factor;

a resampler for resampling the stream of digital data with a resampling ratio approximating a ratio of an output sample rate to a virtual sample rate to generate a stream of digital data at the output sample rate, the virtual sample rate propotionate with the native sample rate; and down-sampling circuitry for down-sampling the resampled data stream by a virtual oversampling factor proportionate with the native oversampling factor.

17. The integrated analog to digital and sample rate converter of claim 16 wherein the output sample rate is greater than the native sample rate of the modulator.

18. The integrated analog to digital and sample rate converter of claim 16 wherein a product of the virtual oversampling factor and the virtual sample rate approximates a product of the native sample rate and the native oversampling factor.

19. The integrated analog to digital and sample rate converter of claim 16 wherein the resampler performs a decimation.

20. The integrated analog to digital and sample rate converter of claim 16 wherein the output sample rate is an audio sample rate and the modulator oversamples in response to a clock having a rate of a sub-multiple of a universal serial bus clock rate.

* * * * *